United States Patent
Zhao et al.

[11] Patent Number: 5,994,775
[45] Date of Patent: Nov. 30, 1999

[54] METAL-FILLED VIA/CONTACT OPENING WITH THIN BARRIER LAYERS IN INTEGRATED CIRCUIT STRUCTURE FOR FAST RESPONSE, AND PROCESS FOR MAKING SAME

[75] Inventors: Joe W. Zhao, San Jose; Wilbur G. Catabay, Saratoga, both of Calif.

[73] Assignee: LSI Logic Corporation, Milpitas, Calif.

[21] Appl. No.: 08/932,614

[22] Filed: Sep. 17, 1997

[51] Int. Cl.⁶ ................................ H01L 23/48
[52] U.S. Cl. .................. 257/751; 438/643; 438/648; 438/653
[58] Field of Search ................ 257/751; 438/643, 438/648, 653

[56] References Cited

U.S. PATENT DOCUMENTS

| | | | |
|---|---|---|---|
| 4,822,753 | 4/1989 | Pintchovski et al. | 437/192 |
| 4,994,410 | 2/1991 | Sun et al. | 437/192 |
| 5,094,981 | 3/1992 | Chung et al. | 437/190 |
| 5,149,672 | 9/1992 | Lifshitz et al. | 437/189 |
| 5,238,872 | 8/1993 | Thalapaneni | 437/190 |
| 5,250,467 | 10/1993 | Somekh et al. | 437/192 |
| 5,254,498 | 10/1993 | Sumi | 437/190 |
| 5,290,588 | 3/1994 | Romero et al. | 427/123 |
| 5,356,835 | 10/1994 | Somekh et al. | 437/192 |
| 5,371,041 | 12/1994 | Liou et al. | 437/192 |
| 5,380,678 | 1/1995 | Yu et al. | 437/190 |
| 5,391,517 | 2/1995 | Gelatos et al. | 437/190 |
| 5,397,742 | 3/1995 | Kim | 437/190 |
| 5,399,526 | 3/1995 | Sumi | 437/190 |
| 5,403,779 | 4/1995 | Joshi et al. | 437/190 |
| 5,407,861 | 4/1995 | Marangon et al. | 437/192 |
| 5,413,669 | 5/1995 | Fujita | 156/643.1 |
| 5,427,666 | 6/1995 | Mueller et al. | 204/192.17 |
| 5,457,069 | 10/1995 | Chen et al. | 437/190 |
| 5,462,895 | 10/1995 | Chen | 437/200 |
| 5,480,836 | 1/1996 | Harada et al. | 437/192 |
| 5,486,492 | 1/1996 | Yamamoto et al. | 437/192 |
| 5,677,237 | 10/1997 | Tsai et al. | 437/192 |
| 5,677,238 | 10/1997 | Gn et al. | 437/194 |
| 5,714,418 | 2/1998 | Bai et al. | 438/627 |

OTHER PUBLICATIONS

Naik, Mehul B., et al., "CVD of Copper Using Copper (I) and Copper (II) β–Diketonates", *Thin Solid Films*, vol. 262, 1995, pp. 60–66.

*Primary Examiner*—Olik Chaudhuri
*Assistant Examiner*—Douglas A. Wille
*Attorney, Agent, or Firm*—John P. Taylor

[57] ABSTRACT

The invention comprises an integrated circuit structure, and a process for making same, comprising a via/contact opening in a dielectric layer; a CVD layer of titanium nitride having a thickness of at least about 50 Angstroms, but not exceeding about 200 Angstroms, on the sidewall and bottom surfaces of the via/contact opening to provide adherence of the filler material to the underlying and sidewall surface of the opening; a CVD barrier layer of tungsten, having a thickness of about 50 Angstroms, but not exceeding about 300 Angstroms, formed over the titanium nitride layer; and the remainder of the via/contact opening filled with a highly conductive metal selected from the group consisting of copper, CVD aluminum, and force-filled aluminum.

15 Claims, 2 Drawing Sheets

METAL-FILLED VIA/CONTACT OPENING WITH THIN BARRIER LAYERS IN INTEGRATED CIRCUIT STRUCTURE FOR FAST RESPONSE, AND PROCESS FOR MAKING SAME

BACKGROUND OF THE INVENTION

1. Field of the Invention

This invention relates to a via/contact opening for an integrated circuit structure filled with conductive metal and a process for making same. More particularly this invention relates to a via/contact opening for an integrated circuit structure filled with highly conductive metal, with thin barrier layers separating the highly conductive metal in the via/contact opening from underlying silicon, and a process for making the structure.

2. Description of the Related Art

In the construction of integrated circuit structures on semiconductor substrates such as a silicon substrate, vias or contact openings are formed through an insulation or dielectric layer, e.g., silicon oxide ($SiO_2$), to electrically connect a metal pattern or wiring on the insulation layer either with a lower level of metal wiring or with elements of active devices, e.g., a source/drain region or a gate electrode of an MOS device, formed in the underlying silicon substrate.

Typically, such vias or contact openings are filled with aluminum metal. To avoid diffusion of the aluminum filler material into the underlying silicon substrate (and diffusion of the silicon into the aluminum) a titanium nitride barrier layer can be formed between the exposed portion of the substrate and the aluminum used to fill the opening. Sometimes this is accomplished by deposition of a titanium layer followed by an anneal in nitrogen to form the titanium nitride barrier layer as well as to form titanium silicide beneath the titanium nitride and in contact with the underlying silicon surface to thereby reduce the contact resistance.

However, as the diameters of the vias or contact openings become smaller, and aspect ratios increase (depth of opening divided by width), it has become more difficult to adequately fill the opening with sputtered aluminum. To solve this problem, it has been proposed to fill the opening with tungsten metal. However, since tungsten does not adhere well to the underlying silicon either an intermediate layer of titanium nitride or a dual layer of titanium silicide/titanium nitride is usually formed over the silicon and beneath the tungsten filler or plug in the opening. The use of titanium silicide can also reduce the contact resistance, for example, from over 100 Ω to as little as 1 Ω for a 0.5 μm diameter contact opening. Such tungsten-filled via/contact openings are shown, for example, in Pintchovski et al. U.S. Pat. No. 4,822,753; Sun et al. U.S. Pat. No. 4,994,410; Lifshitz et al. U.S. Pat. No. 5,149,672; Somekh et al. U.S. Pat. No. 5,250,467; Somekh et al. U.S. Pat. No. 5,356,835; Yu et al. U.S. Pat. No. 5,380,678; Kim U.S. Pat. No. 5,397,742; Marangon et al. U.S. Pat. No. 5,407,861; Fujita U.S. Pat. No. 5,413,669; and Chen U.S. Pat. No. 5,462,895.

The underlying titanium nitride layer used in such tungsten-filled via/contact openings is usually either deposited onto the surface of the via/contact opening (as well as the exposed surface of the silicon substrate at the bottom of the contact opening), or a layer of titanium metal is deposited followed by annealing in nitrogen gas, causing the titanium layer to react with the nitrogen to form titanium nitride (as well as titanium silicide wherever the titanium metal layer is in contact with silicon). The aforementioned Pintchovski et al. U.S. Pat. No. 4,822,753, for example, describes the deposition of titanium nitride over an insulating layer, as well as the sidewall and bottom surfaces of an opening in the insulating layer, by CVD prior to filling the opening with a tungsten plug. The above-mentioned Lifshitz et al. U.S. Pat. No. 5,149,672, for example, teaches the sputter deposition of tungsten nitride over a silicon oxide layer followed by deposition of a tungsten layer by CVD (using $WF_6$ and H) over the titanium nitride layer, with aluminum then optionally sputtered over the wafer.

When titanium metal is deposited and then converted to titanium silicide/nitride, care must be taken to not expose the titanium metal surface to oxygen prior to the annealing step. To avoid this, the aforementioned Sun et al. U.S. Pat. No. 4,994,410 sputters a thin layer of tungsten over the titanium and then anneals in nitrogen to form the underlying titanium silicide/titanium nitride layers, with the nitrogen gas penetrating the tungsten layer to reach the underlying titanium layer. Sun et al. then fill the remainder of the via with CVD tungsten (which cannot be deposited directly over the titanium metal without undesirable side reactions between the titanium metal and the fluorine in the $WF_6$ used to form the CVD tungsten layer). However, the sputtering of tungsten over a titanium metal layer cannot be used satisfactorily with small openings (e.g., diameters less than about 0.5 μm or aspect ratios larger than 2.5).

While the use of tungsten as a filler material for vias and contact openings has been, in the main, satisfactory, there has now arisen a need for faster devices and the higher resistance of tungsten (CVD tungsten resistance is about 11 μΩcm) compared to other metals has resulted in consideration of copper (resistivity about 2 μΩcm) as a metal filler material for vias and contact openings. For example, Gelatos et al. U.S. Pat. No. 5,391,517 shows a via filled with copper. However, as is well known to those skilled in the art, copper is a fast diffuser in silicon and silicon oxide, much faster than aluminum. Furthermore, the copper diffusion is not only vertical, e.g., potentially into the underlying silicon substrate, but also horizontal as well, e.g., into the dielectric material forming the sidewall of the via or contact opening. To obtain proper adherence of the copper to the device substrate and to avoid such undesirable diffusion of the copper, Gelatos et al. provide a composite interface layer comprising a first titanium layer, which is sputtered onto the dielectric to a thickness of about 100–300 Angstroms, followed by a sputter deposition of titanium nitride to a thickness of about 300–500 Angstroms. Another titanium layer is then sputtered over the titanium nitride layer to a thickness of about 100–300 Angstroms. Copper is then deposited over the second layer of titanium to completely fill the opening, and the structure is then annealed to cause the copper to form a titanium copper alloy with the underlying second layer of titanium.

While such a structure apparently adequately protects the Gelatos et al. substrate and opening sidewalls from diffusion of the copper filler, the formation of 300–500 Angstroms of titanium nitride in contact openings as small as 0.5 μm in diameter would be difficult to accomplish by sputtering, and CVD titanium nitride has a high resistance of ~400 μΩcm, compared to ~2 μΩcm for CVD copper (CVD copper is 200 times more conductive than CVD titanium nitride), and therefore the use of CVD titanium nitride would be counterproductive to the use of a high conductivity copper filler material.

However, the need for faster devices, coupled with the need to avoid diffusion of via/contact opening filler materials into either the underlying substrate or the sidewalls of the opening, as well as the shrinkage in the diameter of the via/contact openings and an increase in the aspect ratios of such openings, has created difficulties. It would, therefore, be desirable to provide an integrated circuit structure with via/contact openings having a low resistance filler in the via/contact opening and adequately protected against diffusion of the filler material into either the underlying substrate or the sidewalls of the dielectric in which the opening is formed, even with via/contact opening diameters as small as 0.5 μm and aspect ratios as high as 2.5.

SUMMARY OF THE INVENTION

The invention comprises an integrated circuit structure, and a process for making same, comprising a via/contact opening in a dielectric layer over a semiconductor substrate; a CVD layer of titanium nitride having a thickness of at least about 50 Angstroms, but not exceeding about 200 Angstroms, on the sidewall and bottom surfaces of the via/contact opening to provide adherence of the filler material to the underlying and sidewall surfaces of the via/contact opening; a CVD barrier layer of tungsten, having a thickness of at least about 50 Angstroms, but not exceeding about 300 Angstroms, formed over the titanium nitride layer; and the remainder of the via/contact opening filled with a highly conductive metal selected from the group consisting of copper, CVD aluminum, and force-filled sputtered aluminum.

DETAILED DESCRIPTION OF THE INVENTION

The invention comprises an integrated circuit structure, and a process for making same, comprising a via/contact opening in a dielectric layer over a semiconductor substrate; a CVD layer of titanium nitride having a thickness of at least about 50 Angstroms, but not exceeding about 200 Angstroms, on the sidewall and bottom surfaces of the via/contact opening to provide adherence of the filler material to the underlying and sidewall surface of the via/contact opening; a CVD barrier layer of tungsten, having a thickness of at least about 50 Angstroms, but not exceeding about 300 Angstroms, formed over the titanium nitride layer; and the remainder of the via/contact opening filled with a highly conductive metal selected from the group consisting of copper, CVD aluminum, and force-filled sputtered aluminum. While the invention may be utilized in connection with the filling of via/contact openings of any size or depth, it finds particularly utility with via/contact openings having diameters of 0.5 μm or less down to about 0.2 μm, and aspect ratios of 2.5 or higher, up to as high as 7.

By use of the term "highly conductive metal" herein is meant a metal having a resistance not greater than about 5 μΩcm, and preferably not greater than about 3.5 μΩcm. By use of the term "force-filled aluminum" is meant an aluminum metal layer which has been deposited over a surface containing openings and then subject to sufficient pressure to force the aluminum into the openings to completely fill the openings.

Figure 1:
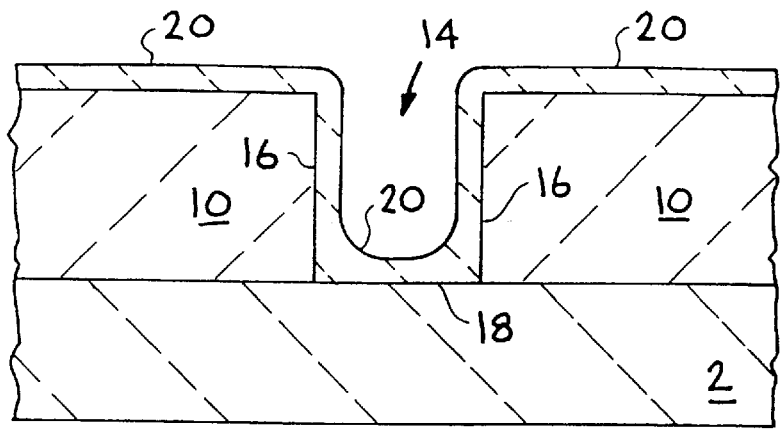
FIG. 1 is a fragmentary vertical cross-sectional view of the structure of the invention after formation of the thin titanium nitride adherence layer in the via/contact opening.

Turning now to FIG. 1, an integrated circuit structure is generally indicated at 2 with a dielectric layer 10 formed thereover with a via/contact opening 14 shown formed through layer 10 to underlying integrated circuit structure 2. Integrated circuit structure 2 may comprise a semiconductor substrate, e.g., a silicon substrate, or may also include a previously formed dielectric layer over such a semiconductor substrate, with a conductive interconnect layer formed over the dielectric layer. Conventionally an opening formed through the first dielectric layer to an underlying semiconductor substrate is designated as a contact opening, whereas openings in subsequent dielectric layers to provide electrical connection between two patterned conductive layers or wiring is termed a via. It will be understood that the invention can be utilized in connection with the filling of either a contact opening or a via, and therefore the use of the terms via or contact opening (or opening) should be deemed to be referring to the same structure unless otherwise identified. However, the invention will find greatest utility in the filling of contact openings wherein the underlying surface at the bottom of the contact opening is a semiconductor substrate such as a silicon substrate.

A CVD titanium nitride adherence layer 20 is shown formed over the surface of dielectric layer 10, as well as the sidewall surfaces 16 of opening 14, and over the exposed surface of underlying integrated circuit structure 2 at 18. The purpose of CVD titanium nitride layer 20 is to provide satisfactory adherence between the underlying integrated circuit structure 2 (e.g., a silicon substrate) and a CVD tungsten barrier layer to be subsequently deposited thereon. CVD titanium nitride layer 20 also serves to prevent any undesired reactions between the underlying material comprising integrated circuit structure 2 (either a metal layer or the semiconductor substrate) and the reactants (such as $WF_6$) used in the deposition of the subsequently formed CVD tungsten barrier layer.

CVD titanium nitride layer 20 is deposited by a chemical vapor deposition (CVD) process to a thickness of at least 50 Angstroms to provide the desired adherence characteristics of the layer. However, since the resistance of even CVD-formed titanium nitride is high (400 μΩcm) relative to the resistance of the CVD tungsten barrier layer (~11 μΩcm) and of the copper filler (~2 μΩcm), the maximum thickness of CVD titanium nitride adherence layer 10 should not exceed about 200 Angstroms, and preferably should not exceed about 100 Angstroms.

In a preferred embodiment, the CVD titanium nitride is formed by placing the substrate in a deposition chamber maintained at a pressure of from about 10 Torr to about 60 Torr and a substrate temperature of from about 300° C. to about 450° C. and flowing into the chamber a vaporized metal organic source of titanium and nitrogen such as tetrakis(diethylamido) titanium (TDEAT) having the formula $[(CH_3CH_2)_N]_t$, or tetrakis(dimethylamido) titanium (TDMAT) having the formula $[(CH_3)_N]_t$, at a flow rate (in either case) equivalent to a rate of from about 1 sccm to about 300 sccm into a 5 liter chamber. The flow of either TDEAT or TDMAT vapors (particularly TDEAT vapors) is preferably accompanied by the flow of $NH_3$ gas into the chamber at a rate equivalent to a rate of from about 1000 sccm to about 30,000 sccm into a 5 liter chamber to ensure the presence of an adequate source of nitrogen for reaction with the titanium being released as the TDEAT or TDMAT decomposes. The deposition is carried out until the desired thickness of titanium nitride, as discussed about, has been deposited over the bottom and sidewall surfaces of opening 14.

Figure 2:
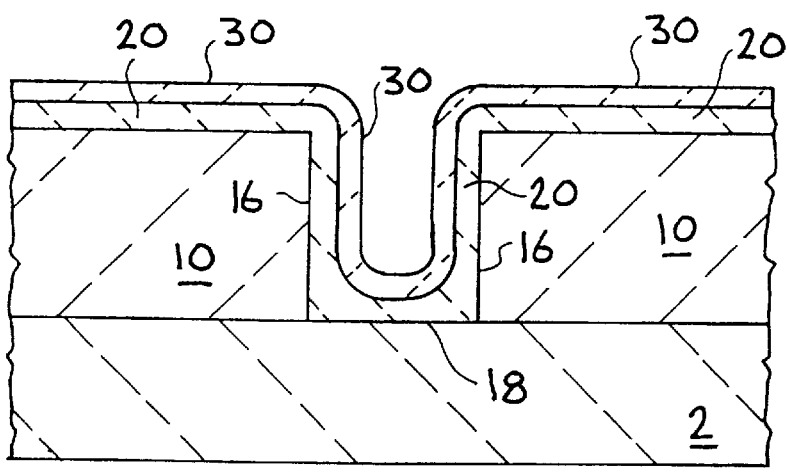
FIG. 2 is a fragmentary vertical cross-sectional view of the structure of the invention after formation of the thin barrier layer of tungsten over the titanium nitride adherence layer in the via/contact opening.

After deposition of CVD titanium nitride adherence layer 20, a barrier layer of CVD tungsten 30 is deposited over CVD titanium nitride layer 20, as shown in FIG. 2. The thickness of tungsten barrier layer 30 will be at least 50 Angstroms, and preferably 100 Angstroms, to provide the minimum protection for the integrated circuit structure against diffusion of the copper filler material either laterally into dielectric layer 10, or downwardly into underlying integrated circuit structure 2. The maximum thickness of tungsten barrier layer 30 should not exceed about 300 Angstroms, and preferably not exceed about 200 Angstroms, to maintain the desired overall low resistance of the contact structure. The deposition of CVD tungsten may be carried out in any conventional manner, such as the well known CVD deposition of tungsten using $WF_6$ as the source of tungsten, and a second reactant such as silane to react with the fluorine as it is released in the reaction.

In addition to the individual minimum and maximum thicknesses of the respective titanium nitride adherence layer 20 and tungsten barrier layer 30, the total or sum of the thicknesses of both layers 20 and 30 should not be less than about 200 Angstroms, and preferably not less than about 250 Angstroms, to provide a minimum amount of protection against diffusion of the highly conductive metal filler material through layers 20 and 30. Since the resistance of CVD tungsten is less than that of CVD titanium nitride, the bulk of this thickness will preferably comprise tungsten, rather than titanium nitride. Furthermore, to minimize the resistance of the contact, while still providing the desired adherence of the layers to the integrated circuit structure, including the sidewalls of the opening and, where appropriate, the semiconductor substrate at the bottom of the opening, the total thickness of layers 20 and 30 should not exceed about 400 Angstroms, and preferably not exceed about 300 Angstroms.

Figure 3:
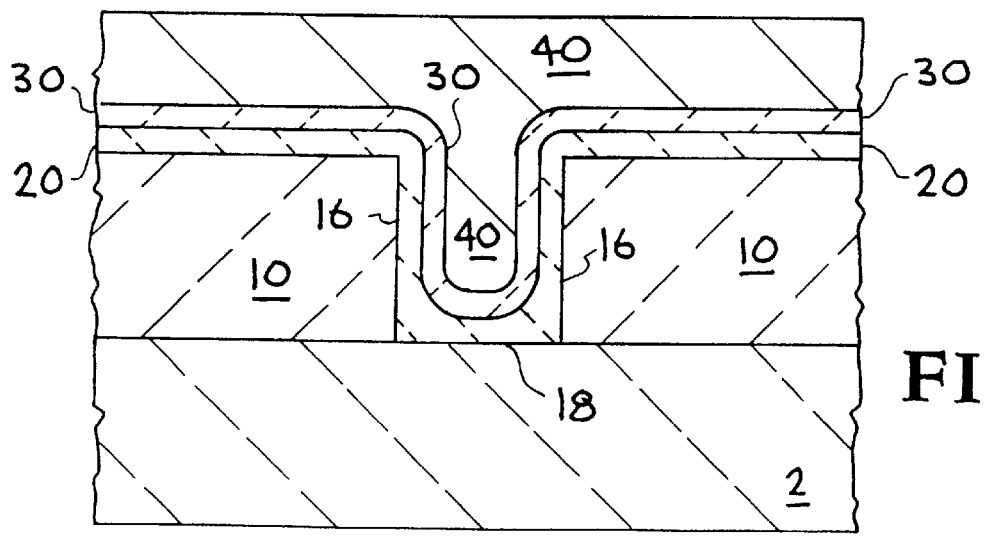
FIG. 3 is a fragmentary vertical cross-sectional view of the structure of the invention after filling of the remainder of the via/contact opening with a highly conductive metal over the tungsten barrier layer in the via/contact opening.
Figure 4:
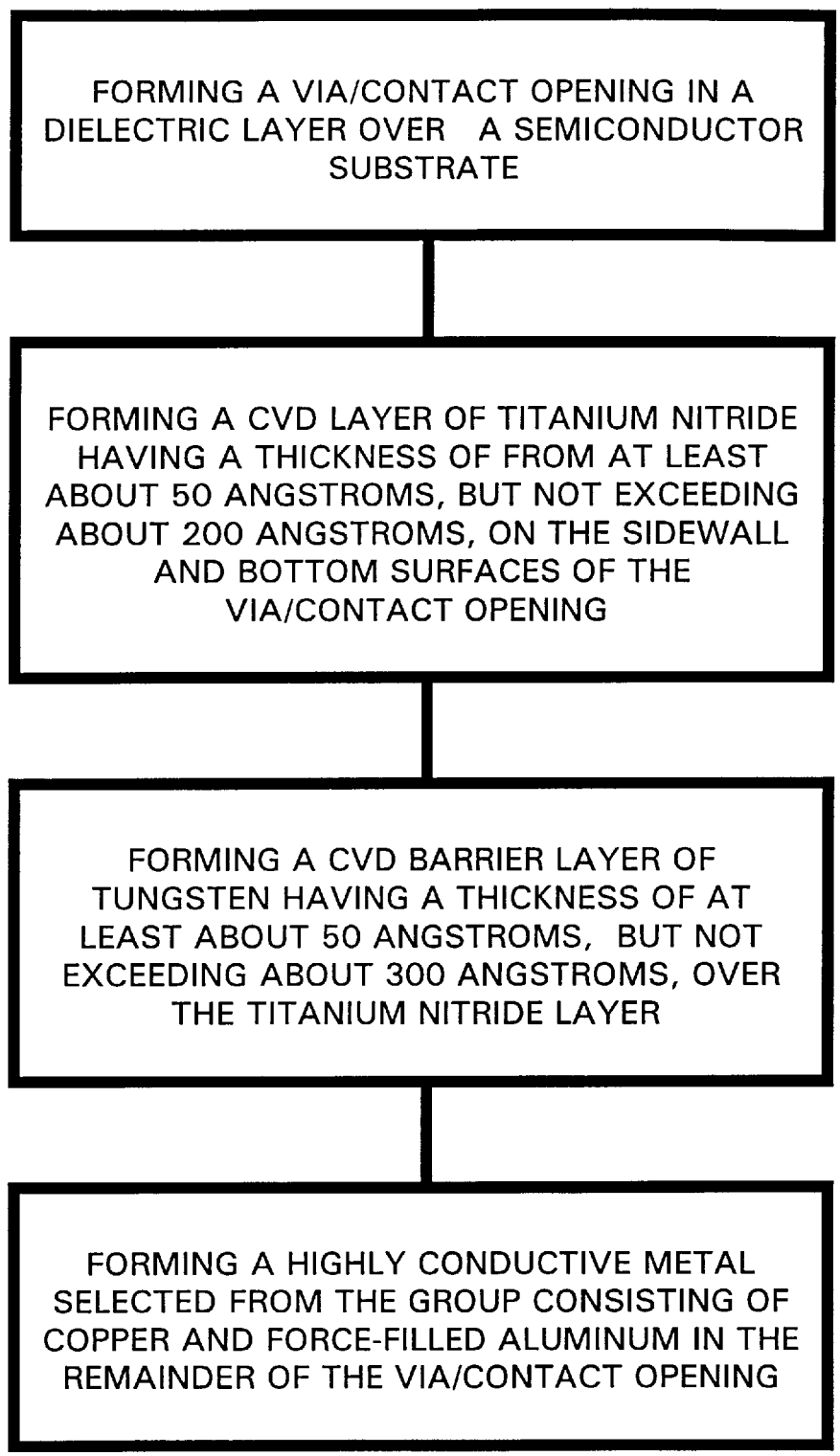
FIG. 4 is a flowsheet illustrating the process of the invention.

After the formation of tungsten barrier layer 30 to the desired thickness as previously discussed, the remainder of opening 14 is filled with a layer 40 of highly conductive metal such as copper or aluminum, as shown in FIG. 3. When copper is used to fill the remainder of opening 14, the copper may be initially applied to the structure using by chemical vapor deposition (CVD copper) or using well know copper plating techniques which are now commercially available.

When CVD copper is used as the filler material, the copper is deposited by placing the substrate in a deposition chamber maintained at a pressure of from about 500 milliTorr to about 10 Torr and a substrate temperature of from about 150° C. to about 250° C. and flowing into the chamber a vaporized source of copper. Usually this deposition will be carried out until about 5,000 Angstroms of copper has been deposited on the surface of underlying tungsten barrier layer 30, indicative of the complete filling of the remainder of opening 14 in dielectric layer 10 with copper. Alternatively, the copper deposition time period may be empirically determined for a given thickness of dielectric layer 10 to fill the via or contact opening. Copper filler layer 40 may also be deposited over the structure and into opening 14 by an electrodeless copper plating technique, as is well known to those skilled in the art.

Alternatively, when aluminum is used as the filler material, either CVD aluminum or force-filled aluminum may be used to fill the remainder of opening 14. When CVD aluminum is used to fill the remainder of opening 14, high purity aluminum, i.e. 99.99+wt. % aluminum is usually used to fill opening 14. A thin layer of an aluminum/copper alloy is then sputtered over the surface, followed by an anneal to diffuse some of the copper from this alloy into the high purity aluminum filler in opening 14 to improve the conductivity of the aluminum filler material.

When force-filled aluminum is used and the via/contact opening diameter is 0.5 μm or less and/or the aspect ratio is 2.5 or higher, a 10,000 Angstrom layer of aluminum is deposited over the structure by any convenient deposition method and the structure is then placed in a pressure chamber maintained at a pressure of at least about 150 mPa, while heating the substrate to a temperature of at least about 400° C. (to soften the aluminum). This forces the aluminum into the small openings (which cannot be adequately filled using conventional aluminum deposition techniques).

To further illustrate the practice of the invention, a 600 nm thick layer of silicon oxide ($SiO_2$) was deposited on three silicon substrates and a series of openings, each having a diameter of about 0.45 μm, were formed through the silicon oxide layer to the underlying silicon surface on each substrate. The substrates were then placed in a 4 liter sealed CVD chamber and 3 sccm of TDEAT and 21,000 sccm of $NH_3$ were flowed through the chamber while the temperature of the substrates was maintained at 300° C. and the chamber pressure was maintained at 40 Torr. After 1 minute the flows of TDEAT and ammonia were shut off and one of the substrates was removed to measure the thickness of the CVD titanium nitride layer deposited thereon. The thickness of the CVD titanium nitride layer was measured by a 4D probe. About 100 Angstroms of CVD titanium nitride was found to have deposited on the substrate and on the sidewalls and bottom of the openings.

CVD tungsten was deposited over the remainder of the coated substrates in the chamber by flowing 5 sccm of $WF_6$ and 10 sccm of $SiH_4$ into the chamber while the temperature of the substrates was maintained at 390° C. and the chamber pressure was maintained at 10 Torr. After 0.5 minutes the flows of $WF_6$ and $SiH_4$ were shut off and another substrate was removed from the chamber to measure the amount of CVD tungsten deposited over the CVD titanium nitride layer on the surface of the $SiO_2$ layer and on the CVD titanium nitride surfaces in the openings. The thickness of the CVD tungsten layer was measured by a 4D probe and about 200 Angstroms of CVD tungsten was found to have deposited over the CVD titanium nitride layer.

About 8,000 Angstroms of CVD copper was then formed over the remaining substrate to complete the filling of the openings chamber by flowing liquid (hfac)copper(vtms) into the chamber at a rate of 0.5 ml/minute (where hfac=1,1,1, 5,5,5-hexafluoroacetylacetonate and vtms= vinyltrimethylsilane), and also flowing nitrogen into the chamber at a rate of about 50 sccm, while the temperature of the substrate was maintained at 210° C. and the chamber pressure was maintained at 500 milliTorr.

The conductivity of the CVD titanium nitride/CVD tungsten/CVD copper filled contact openings in the third substrate (100 Angstrom TiN/200 Angstrom W/8,000 Angstrom Cu) were then tested by a Keithley Electrical tester to compare the conductivity to a contact opening having a 300 Angstroms CVD titanium nitride barrier layer and filled with CVD copper. The conductivity of the filled openings of the invention were 60% higher compared with the conductivity of openings filled only with a 300 Angstroms CVD titanium nitride barrier layer and CVD copper, i.e., no tungsten barrier layer.

Thus, the invention provides an improved integrated circuit structure comprising a high conductivity via/contact opening while protecting the structure from diffusion of the highly conductive metal filler material either into dielectric sidewalls of the opening or into a silicon or metal surface beneath the opening, while also providing good adherence of the filler material to the surfaces of the opening.

Having thus described the invention what is claimed is:

1. An integrated circuit structure comprising:
   a) a via/contact opening in a dielectric layer over a semiconductor substrate;
   b) a CVD layer of titanium nitride having a thickness of at least about 50 Angstroms, but not exceeding about 200 Angstroms, on the sidewall and bottom surfaces of said via/contact opening to provide adherence of filler material to the underlying and sidewall surfaces of said via/contact opening;
   c) a CVD barrier layer of tungsten, having a thickness of at least about 50 Angstroms, but not exceeding about 300 Angstroms, formed over said titanium nitride layer; and
   d) a highly conductive metal, selected from the group consisting of copper and force-filled aluminum, filling the remainder of said via/contact opening.

2. The integrated circuit structure of claim 1 wherein the thickness of said CVD titanium nitride layer ranges from about 50 Angstroms to about 100 Angstroms.

3. The integrated circuit structure of claim 1 wherein the thickness of said CVD tungsten layer ranges from about 50 Angstroms to about 200 Angstroms.

4. The integrated circuit structure of claim 1 wherein the combined thicknesses of said CVD titanium nitride layer and said CVD tungsten layer is at least about 200 Angstroms.

5. The integrated circuit structure of claim 1 wherein the combined thicknesses of said CVD titanium nitride layer and said CVD tungsten layer is at least about 250 Angstroms.

6. The integrated circuit structure of claim 1 wherein the combined thicknesses of said CVD titanium nitride layer and said CVD tungsten layer does not exceed about 400 Angstroms.

7. The integrated circuit structure of claim 1 wherein the combined thicknesses of said CVD titanium nitride layer and said CVD tungsten layer does not exceed about 300 Angstroms.

8. The integrated circuit structure of claim 1 wherein said highly conductive metal comprises CVD copper.

9. The integrated circuit structure of claim 1 wherein said highly conductive metal comprises copper deposited by plating.

10. The integrated circuit structure of claim 1 wherein said highly conductive metal comprises force-filled aluminum.

11. The integrated circuit structure of claim 1 wherein said highly conductive metal comprises CVD aluminum.

12. The integrated circuit structure of claim 1 wherein said via/contact opening has a diameter no greater than 0.5 $\mu$m, and an aspect ratio of at least 2.5.

13. An integrated circuit structure comprising:
    a) a via/contact opening in a dielectric layer, said via/contact opening having a diameter no greater than 0.5 $\mu$m, and an aspect ratio of at least 2.5;
    b) a CVD layer of titanium nitride of at least about 50 Angstroms, but not exceeding about 100 Angstroms, on the sidewall and bottom surfaces of said via/contact opening to provide adherence of filler material to the underlying and sidewall surfaces of said via/contact opening;
    c) a CVD barrier layer of tungsten, having a thickness ranging from about 50 Angstroms, but not exceeding about 200 Angstroms, formed over said titanium nitride layer, said combined thicknesses of said CVD titanium nitride and said CVD tungsten layers having a minimum thickness of at least 200 Angstrom; and
    d) a highly conductive metal, consisting essentially of copper, filling the remainder of said via/contact opening.

14. An integrated circuit structure comprising:
    a) a via/contact opening in a dielectric layer over a semiconductor substrate, said via/contact opening having a diameter no greater than 0.5 $\mu$m, and an aspect ratio of at least 2.5;
    b) a CVD layer of titanium nitride having a thickness of at least about 50 Angstroms, but not exceeding about 100 Angstroms, on the sidewall and bottom surfaces of said via/contact opening to provide adherence of filler material to the underlying and sidewall surfaces of said via/contact opening;
    c) a CVD barrier layer of tungsten, having a thickness of at least about 50 Angstroms, but not exceeding about 200 Angstroms, formed over said titanium nitride layer, said combined thicknesses of said CVD titanium nitride and said CVD tungsten layers having a minimum thickness of at least 200 Angstrom; and
    d) a highly conductive metal, consisting essentially of force-filled aluminum, filling the remainder of said via/contact opening.

15. A process for making an integrated circuit structure comprising:
    a) forming a via/contact opening in a dielectric layer over a semiconductor substrate;
    b) forming a CVD layer of titanium nitride having a thickness of at least about 50 Angstroms, but not exceeding about 200 Angstroms, on the sidewall and bottom surfaces of said via/contact opening to provide adherence of filler material to the underlying and sidewall surfaces of said via/contact opening;
    c) forming a CVD barrier layer of tungsten, having a thickness of at least about 50 Angstroms, but not exceeding about 300 Angstroms, over said titanium nitride layer; and
    d) forming a highly conductive metal selected from the group consisting of copper and force-filled aluminum in the remainder of said via/contact opening.

* * * * *